(12) United States Patent
Lundqvist

(10) Patent No.: US 6,822,980 B2
(45) Date of Patent: Nov. 23, 2004

(54) TUNABLE SEMICONDUCTOR LASER WITH INTEGRATED WIDEBAND REFLECTOR

(75) Inventor: Lennart P. O. Lundqvist, Kista (SE)

(73) Assignee: ADC Telecommunications, Inc., Eden Prairie, MN (US)

( * ) Notice: Subject to any disclaimer, the term of this patent is extended or adjusted under 35 U.S.C. 154(b) by 109 days.

(21) Appl. No.: 09/915,046

(22) Filed: Jul. 25, 2001

(65) Prior Publication Data

US 2003/0021305 A1 Jan. 30, 2003

(51) Int. Cl.[7] ................................................ H01S 3/10
(52) U.S. Cl. .......................................... 372/20; 372/50
(58) Field of Search ..................... 372/20, 92, 43–50, 372/54, 75, 32

(56) References Cited

U.S. PATENT DOCUMENTS 5,440,576 A   8/1995   Welch et al.

FOREIGN PATENT DOCUMENTS

| EP | 0 182 040 A | 5/1986 |
|----|-------------|--------|
| JP | 03212363    | 8/1991 |
| JP | 05055689    | 3/1993 |

OTHER PUBLICATIONS

Kunli T et al., "Narrow Linewidth Operation in Long Cavity 1.5 UM–MQW DBR Laser," Electronics Letters, IEE Stevenage, GB, vol. 27, No. 9, Apr. 25, 1991, pp. 691–692, XP000186219, ISSN: 0013–5194, Figure 1.

Tohmori Y et al, "Wide–Wavelength Tunable Distributed Bragg Reflector Lasers with Super Structure Grating (SSG)," Optoelectronics Devices and Technologies, Mita Press, Tokyo, JP, vol. 9, No. 2, Jun. 1, 1994, pp. 177–192, XP000455300, ISSN: 0912–5434, p. 186, line 6–15, Figure 10.

Kim B–S et al, "Dynamic analysis of Widely Tunable Laser Diodes Integrated with Sampled– and Chirped–Grating Distributed Bragg Reflectors and an Electroabsorption Modulator," IEICE Transactions on Electronics, Institute of Electronics Information and Comm. Eng. Tokyo, JP, vol. E81–C, No. 8, Aug. 1998, pp. 1342–1349, XP000848540, ISSN: 0916–8524, whole document.

ISR for PCT/IB02/02648, mailed Dec. 10, 2003.

*Primary Examiner*—Don Wong
*Assistant Examiner*—Tuan N. Nguyen
(74) *Attorney, Agent, or Firm*—Carlson, Caspers, Vandenburgh & Lindquist

(57) ABSTRACT

A wide band reflector, for example a wideband grating reflector is provided as the output coupler of a semiconductor laser. This permits the semiconductor laser to be integrated with other components on a single semiconductor substrate, if desired, without requiring that the laser beam be emitted from the tuning element. Thus, the laser can be tuned over a wide bandwidth with efficient power extraction and high wavelength selectivity.

53 Claims, 6 Drawing Sheets

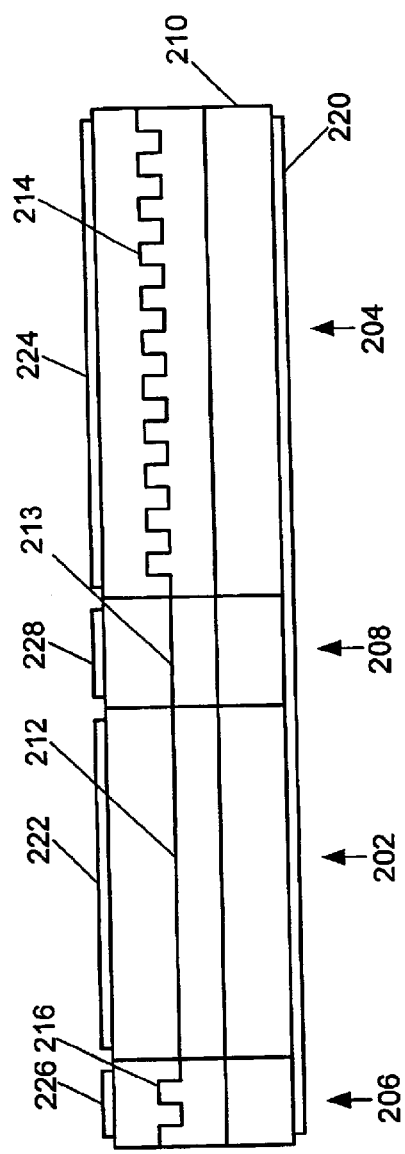
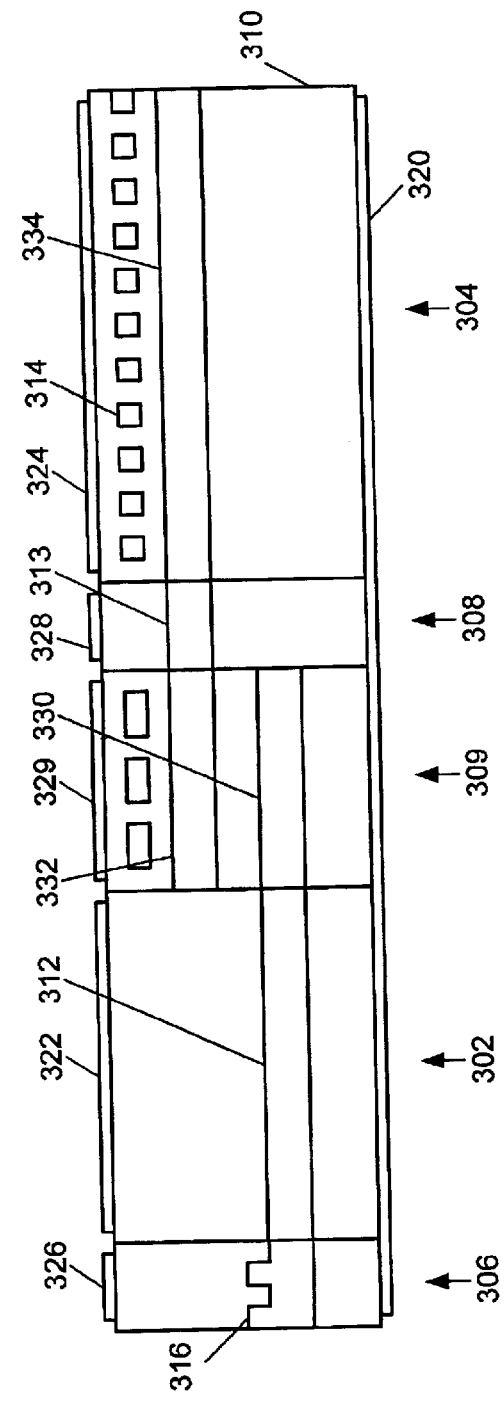
FIG. 6
FIG. 7

TUNABLE SEMICONDUCTOR LASER WITH INTEGRATED WIDEBAND REFLECTOR

FIELD OF THE INVENTION

This invention relates to tunable semiconductor lasers and methods of making and using the lasers. In addition, the invention relates to tunable semiconductor lasers with grating reflector structures and methods of making and using the lasers.

BACKGROUND OF THE INVENTION

Semiconductor lasers have become an important component in a variety of devices and areas of use. One significant example of use is in optical communications devices and networks. One useful aspect of many semiconductor lasers is their tunability. Semiconductor lasers may be tuned using a variety of methods including, for example, the use of a grating reflector structure. For a variety of lasers, including those that are described as Distributed Bragg Reflector (DBR) lasers, the grating reflector structure and the gain region are separate elements of the laser. An example of a DBR semiconductor laser (50) is illustrated in FIG. 1, showing a gain element 52 and a tuning element 54 with a grating reflector structure 56. The grating reflector structure 56 reflects at least a portion of light having a wavelength that corresponds approximately to a multiple of the optical length of the period of the grating reflector structure and transmits light of other wavelengths. The reflected light is returned through the gain region 57. A portion of the reflected light can then be emitted as a laser beam 58. Conventionally, the laser beam 58 is emitted through a cleaved facet 59 of the semiconductor material that forms the laser. The cleaved facet 59 operates as an output coupler, also reflecting a portion of the laser light, thereby forming the laser cavity with the grating reflector structure 56.

The cleaved facet 59 is typically formed by cleaving the semiconductor material along a crystal plane and removing the surrounding semiconductor material. Use of a cleaved facet as the output coupler does not, however, permit integration of the laser 50 with other components, such as a modulator or amplifier, on the same semiconductor substrate. These other components are manufactured separately and then mounted in a desired alignment relative to the laser. The laser beam 58 propagates through free space from the laser 50 to the other components.

As an alternative, a semiconductor laser 60 can be formed in which the laser beam 70 is emitted from the tuning element 64 instead of the gain element 62, as illustrated in FIG. 2. A cleaved facet is not necessary at the end of the tuning element 64 because the grating reflection structure 66 provides sufficient reflectivity to form the laser cavity with the end reflector 68. The end reflector may be a cleaved surface or, optionally, may be a reflective coating 68 provided on the cleaved facet to enhance reflection from the end of the cavity.

The reflectivity of the grating structure 56 in the laser 50 illustrated in FIG. 1 may be relatively high, since the output from the laser is taken through the cleaved facet 59. High reflectivity on the back reflector enhances the output power. On the other hand, in the laser 60 illustrated in FIG. 2, the reflectivity of the grating reflective structure 66 is substantially lower, so as to permit efficient output of the laser beam 70.

A relatively long grating reflective structure is required for high wavelength selectivity: a narrow reflection bandwidth leads to single mode operation. There is, however, some absorption associated with a grating reflective structure, which varies when the grating reflective structure is tuned. This is not a significant problem for the laser 50 having a cleaved facet output coupler, since the variable losses are made up for by amplification in the gain element 57. This can be a significant problem, however, in the laser 60 that uses the grating reflector as the output coupler, since the power of the output beam can become unacceptably low due to absorption losses in the grating reflector. Furthermore, since the absorption losses in the grating reflector tune with the reflection wavelength of the grating reflector, the output power from the laser also becomes dependent on the operating wavelength of the laser.

Therefore, while the use of a tunable grating reflector as the output coupler permits the laser to be integrated with other components, the laser performance is compromised.

SUMMARY OF THE INVENTION

Generally, the present invention relates to tunable semiconductor lasers and methods of making and using the tunable semiconductor lasers. The devices and methods illustrated herein can provide a semiconductor laser that can be integrated with other components on a single semiconductor substrate, if desired, without requiring that the laser beam be emitted from the tuning element. In at least some embodiments, this results in good output power and wavelength selectivity. In general, the invention is directed to providing a wideband grating reflector as the output coupler of the laser.

One embodiment of the invention is directed to a tunable semiconductor laser that includes a gain region, including an active waveguide, disposed on a substrate. A tuning region is also disposed on the substrate and has a tunable, wavelength-selective reflector disposed to reflect light emitted from a first end of the active waveguide. The tuning region is tunable over a laser wavelength tuning range. An output coupler is disposed on the substrate to reflect a portion of light received from a second end of the active waveguide. The output coupler includes a wide bandwidth grating reflector structure having a reflection bandwidth approximately equal to the laser wavelength tuning range.

Another embodiment of the invention is directed to a method of operating a tunable semiconductor laser, that includes coupling light out of a tunable semiconductor laser using a wide bandwidth grating reflector structure having a reflectivity bandwidth substantially equal to a laser wavelength tuning range.

Another embodiment of the invention is directed to a tunable semiconductor laser that includes a substrate, amplifying means for amplifying light disposed on the substrate and reflecting means for selectively reflecting light at a particular wavelength back to the amplifying means. The laser also includes grating output coupling means for coupling light out from the amplifying means, wherein a reflectivity bandwidth of the grating output coupling means is approximately equal to a laser wavelength tuning means.

Another embodiment of the invention is directed to a communications system that includes an optical transmitter unit, an optical receiver unit, and a fiber optic communications link coupled between the optical transmitter unit and the optical receiver unit. The optical transmitter unit has a laser that includes a substrate, with a gain region disposed thereon, the gain region including an active waveguide. A tuning region is also disposed on the substrate and includes a tunable, wavelength-selective reflector disposed to reflect light emitted from a first end of the active waveguide. The tuning region is tunable over a laser wavelength tuning range. The laser also includes an output coupler disposed on the substrate to reflect a portion of light received from a second end of the active waveguide. The output coupler includes a wide bandwidth grating reflector structure having a reflection bandwidth approximately equal to the laser wavelength tuning range.

Another embodiment is directed to a tunable semiconductor laser, that includes a gain region disposed on a substrate, the gain region including an active waveguide. The laser also includes a tuning region disposed on the substrate, where the tuning region comprises a tunable, wavelength-selective reflector disposed to reflect light emitted from a first end of the active waveguide. A reflection spectrum of the tuning region has at least a two reflection peaks separated by a peak wavelength separation. An output coupler is disposed on the substrate to reflect a portion of light received from a second end of the active waveguide. The output coupler includes a wide bandwidth grating reflector structure with a second reflection bandwidth wider than the peak wavelength separation.

Another embodiment of the invention is directed to a method of operating a tunable semiconductor laser. The method includes coupling light out of a tunable semiconductor laser using a wide bandwidth grating reflector structure having a reflectivity bandwidth wider than a separation between reflectivity peaks of the tuning region of the laser.

Another embodiment of the invention is directed to a tunable semiconductor laser that includes a substrate, amplifying means for amplifying light disposed on the substrate, and reflecting means for selectively reflecting light at a particular wavelength back to the amplifying means. The tunable semiconductor laser also includes output coupling means for coupling light out from the amplifying means, wherein a reflectivity bandwidth of the output coupling means is wider than a separation between reflection peaks of the reflecting means.

The above summary of the present invention is not intended to describe each disclosed embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 6 is a schematic cross-sectional view of a second embodiment of a semiconductor laser, according to the invention;

FIG. 7 is a schematic cross-sectional view of a third embodiment of a semiconductor laser, according to the invention;

Figure 1:
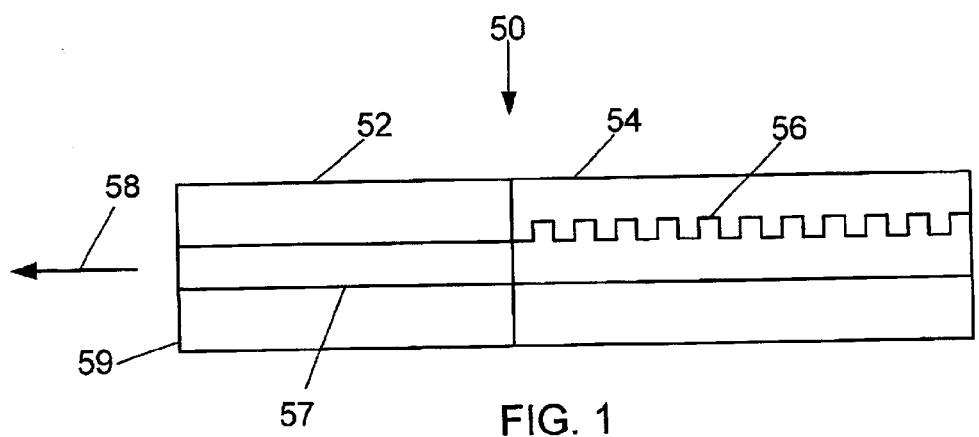
FIG. 1 is a schematic cross-sectional view of one embodiment of a conventional semiconductor laser with operating electrodes omitted, a laser beam is emitted from a cleaved facet of this laser.
Figure 2:
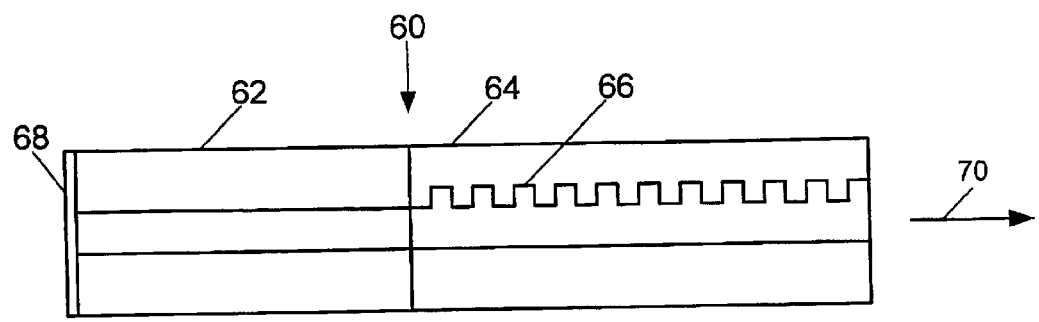
FIG. 2 is a schematic cross-sectional view of another embodiment of a conventional semiconductor laser with operating electrode omitted, a laser beam is emitted from the tuning section of this laser.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE PREFERRED EMBODIMENT

The present invention is believed to be applicable to tunable semiconductor lasers and methods of making and using the lasers. In particular, the present invention is directed to tunable semiconductor lasers with grating reflector structures and methods of making and using the lasers. While the present invention is not so limited, an appreciation of various aspects of the invention will be gained through a discussion of the examples provided below.

Generally, the tunable semiconductor lasers of the invention include a substrate and at least three parts: a gain region, a tuning region, and an output coupler. The tunable semiconductor lasers can also include other regions, such as an adjustable phase region. The concepts, structures, and device configurations described herein can also be applied to other semiconductor lasers with additional or alternative regions and components.

In general, the gain region of the semiconductor laser produces and amplifies the light that is to be emitted by the laser as a laser beam. The tuning region includes a tunable grating reflector structure that permits tuning of the frequency of the emitted laser beam. The output coupler includes a short grating reflector structure that has a wide reflection bandwidth. The output coupler forms a laser cavity with another reflecting element, such as the tunable grating reflector. The output coupler typically has a wide reflection bandwidth that avoids the need for a cleaved facet output coupler, but which also avoids the problems associated with using the tunable grating reflector structure as the output coupler. Thus, use of the present invention permits the laser to be integrated with other components while maintaining high output power which is stable as a function of wavelength.

In addition, because the semiconductor lasers of the invention do not typically contain a cleaved facet as the output coupler, the semiconductor lasers may be tested while still part of the semiconductor wafer from which the semiconductor laser is formed. This permits determination of laser suitability and quality at an earlier stage in the manufacturing process, which can reduce the time and materials spent in further manufacture of unsuitable lasers.

Another advantage afforded by the present invention is that the reflectivity of the output coupler may be tailored to have a desired reflectivity profile, so that the output power of the laser varies with operation wavelength in a manner that is desired by the designer. This degree of freedom is not possible where the output coupler is a cleaved facet.

The semiconductor laser configuration of the present invention addresses the problems of present semiconductor lasers. For example, if the laser beam is emitted from a cleaved facet as in some conventional lasers, the semiconductor laser in operation is typically provided on a semiconductor substrate that is physically separate from other components of the laser system. The laser beam propagates through free space to the other components, thus requiring alignment of the components within a housing. The present invention permits integration of the laser with other devices.

There are additional problems where the laser beam is emitted from a tuning section, as in other conventional designs. In this case, the transmission of light through the tuning section should be high to permit efficient extraction of the laser light. This means that the length of the grating reflection structure should be short. However, short grating length results in reduced selectivity, which may lead to non-single-mode operation. Therefore, a certain degree of loss must be present in order to obtain single-mode operation. Furthermore, the losses increase when the tuning section is tuned. The present invention permits broadband output coupling without introducing the significant losses of the tuning section, while still permitting integration of the laser with other devices.

Figure 3:
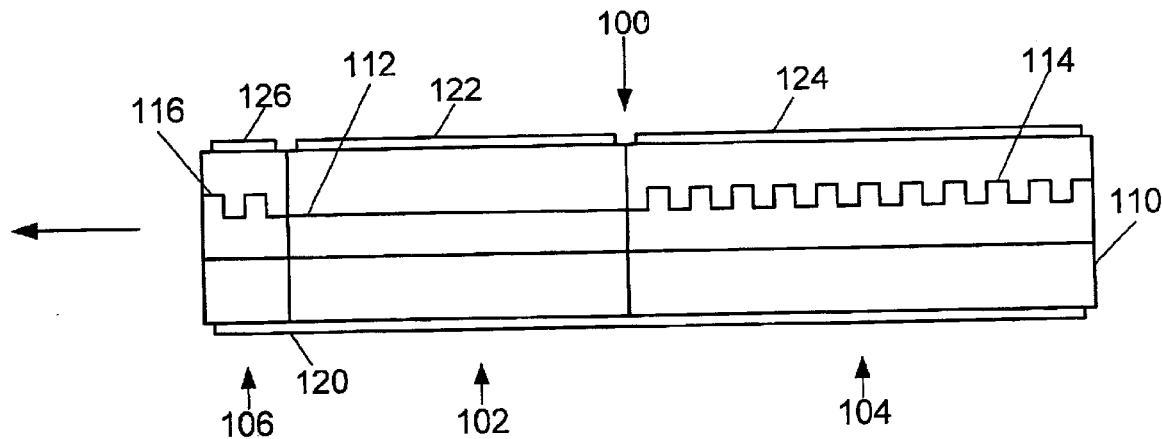
FIG. 3 is a schematic cross-sectional view of one embodiment of a semiconductor laser, according to the invention.

One particular embodiment of a tunable semiconductor laser 100 according to the invention is illustrated in FIG. 3. The tunable semiconductor laser 100 includes a substrate 110 upon which is disposed a gain region 102, a tuning region 104, and an output coupler 106. The substrate 110 and other components of the tunable semiconductor laser can typically be formed using semiconductor materials such as, for example, GaAs, $Al_{1-x}Ga_xAs$, InP, and $In_{1-x}Ga_xAs_yP_{1-y}$. It will be appreciated that many other semiconductor materials may also be used for forming the semiconductor laser 100, depending upon different design factors, such as the desired operating wavelength of the laser.

A waveguide 112 runs along the substrate from the tuning region 104 to the output coupler 106 to confine the laser light oscillating within the laser cavity formed between the output coupler 106 and the tuning region 104. The confinement is typically provided by the waveguide 112 in both the vertical and horizontal directions.

Typically, although not necessarily, a common electrode 120 is provided for all of the laser parts. Individual electrodes, for example electrodes 122, 124, and 126 are provided for each individual tunable or gain region and a desired potential is applied between the common electrode 120 and the appropriate individual electrode 122, 124 and 126. For example, the electrode 122 provides a current to the gain region 102 to produce optical gain. Electrodes 124 and 126 may respectively provide current to the tuning region 104 and, optionally, the output coupler 106. The injection of carriers into the semiconductor changes its refractive index. Therefore, provision of a current to the tuning region 104 or the output coupler 106 may be used to change an operating wavelength of that particular section. It will be appreciated that individual laser regions may each be provided with two individual electrodes that are separate from electrodes of other regions.

The tuning region 104 includes a tunable grating reflector structure 114 and an electrode 124 for applying a tuning current. One suitable tunable grating reflector structure includes a periodic square well grating, as illustrated in FIG. 3. The optical length of the period of the grating determines, at least in part, the wavelengths of light that are at least partially reflected by the grating back into the gain region 102. Other wavelengths of light are not reflected and are lost. The tuning region 104 may be tuned by a variety of methods including, for example, injecting current from the electrode 124 to alter the indices of refraction of the materials that form the tunable grating reflector structure, thereby altering the optical length of the grating period. It will be appreciated that the grating structure need not have a uniform period throughout its length, but that the period may vary along its length. For example, the period may have a relatively low value at one end and increase in value to the other end. Such a grating may be referred as being "chirped".

The tunable grating reflector structure 114 of the tuning region 104 is typically selected to reflect at least 50% of light at the desired laser frequency back towards the gain region 102. A tunable grating reflector structure may be selected to reflect at least 75%, 90%, or even in excess of 95% of light at the desired laser frequency. Such a high reflectivity results in little leakage of light at the desired laser frequency from the tunable grating reflector structure. Generally, the reflectance and the bandwidth of the reflection depend on the length of the tunable grating reflector structure. The reflection bandwidth increases with a reduced grating structure length and also with increased nonuniformity in the grating periodicity (chirp). A longer tunable grating reflector structure typically has higher reflectivity and a narrower bandwidth (as measured, for example, as full width at half maximum (FWHM)). In a semiconductor laser operating at approximately 1300 or 1550 nm, the tunable grating reflector structure typically has a length of 300 $\mu$m to 600 $\mu$m, more typically in the range 450 $\mu$m to 550 $\mu$m.

The output coupler section 106 includes a wide bandwidth grating reflector structure 116. The wide bandwidth grating reflector structure 116 can be untuned or, optionally, tunability may be provided by injecting carriers into the output coupler 106 via the electrode 126, if desired.

In contrast to the tunable grating reflector structure 114, the wide bandwidth grating reflector structure 116 is designed to provide a wide bandwidth reflectivity. To achieve the wide bandwidth reflectivity, the wide bandwidth grating reflector structure 116 is typically substantially shorter than the tunable grating reflector structure 114 of the tuning region 104. This results in the wide bandwidth grating reflector structure 116 having substantially lower wavelength selectivity and lower reflectivity at the laser wavelength than the tunable grating reflector structure 114.

In some embodiments, the tunable grating reflector structure 114 of the tuning region 104 is at least five times longer, and more typically, at least ten times longer, than the wide bandwidth grating reflector structure 116 of the output coupler section 106. As an example, in the embodiment described above for a semiconductor laser operating at wavelengths of approximately 1300 or 1550 nm, the wide bandwidth grating reflector structure may have a length in the range of about 3 $\mu$m to 100 $\mu$m, depending on the range over which the laser 100 is to be tuned. For example, for tuning over a range of about 8 nm, as is typical for a DBR laser, the length of the wide bandwidth grating reflector structure 116 may be in the range 15 $\mu$m to 30 $\mu$m. For a laser having a wider tuning range, for example over the range 1530 nm–1560 nm, the length of a periodic wide bandwidth grating reflector structure 116 may be in the range 5 $\mu$m–10 $\mu$m. In some designs, a very short grating length may lead to a low reflectivity that is lower than desired. A deeper grating (deeper refractive index modulation) may be used to increase the reflectivity, although a deeper grating may increase the absorption losses. Therefore, instead of relying simply on reducing the grating length to increase the reflectivity bandwidth, the grating structure may also be chirped.

Figure 10A:
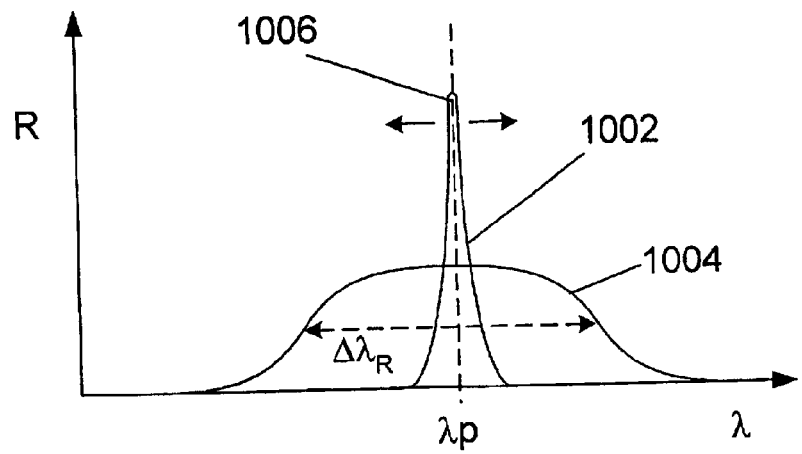
FIGS. 10A and 10B schematically illustrate reflection profiles of the output coupler and various tuning elements of a laser according to the present invention.

A graph, illustrated in FIG. 10A, shows plots of reflectivity, R, as a function of wavelength, $\lambda$, for both the tunable grating reflector structure 114, curve 1002, and the wide bandwidth grating reflector structure 116, curve 1004. The reflectivity profile 1002 of the tunable grating structure 114 has a higher reflectivity and narrower bandwidth than the reflectivity profile 1004 of the wide bandwidth grating reflector structure 116. The arrows indicate that the value of wavelength, $\lambda_p$, of the reflection peak 1006 in the narrowband reflectivity profile 1002 may be changed by tuning the tunable grating reflector structure 114, for example by changing the tuning current passing through the tuning region 104. The wide bandwidth grating structure 116 may have a reflection bandwidth, $\Delta\lambda_R$, that is approximately equal to the tuning range of the laser 100, or larger.

Another indication of the suitability of the wide bandwidth grating reflector structure 116 is the reflectivity of the grating reflector structure at the laser frequency. Generally, in operation, the reflectivity at the laser frequency is not more than about 25%, typically, not more than about 10%, and, in some embodiments, not more than about 5%. The reflectivity is generally sufficient to permit gain saturation, typically, at least about 1%. In determining the level of reflectivity of the wide bandwidth grating reflector structure 116, there is a trade-off between laser threshold current and output power. The reflectivity should be sufficiently high as to avoid high threshold currents, but should also be sufficiently low as to permit efficient power extraction from the laser.

Figure 4:
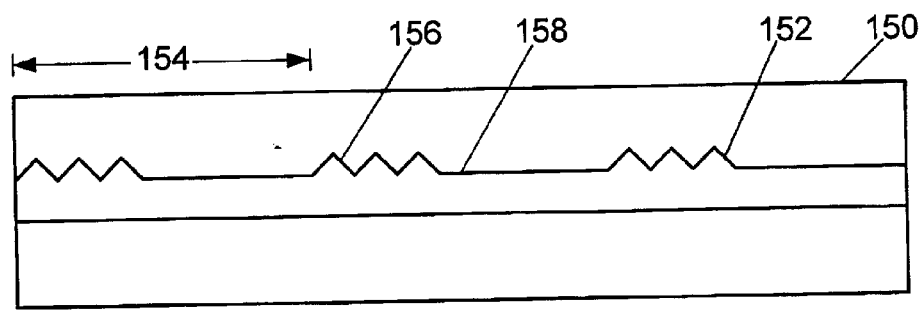
FIG. 4 is a schematic cross-sectional view of one alternative embodiment of a grating reflector structure, according to the invention.
Figure 5:
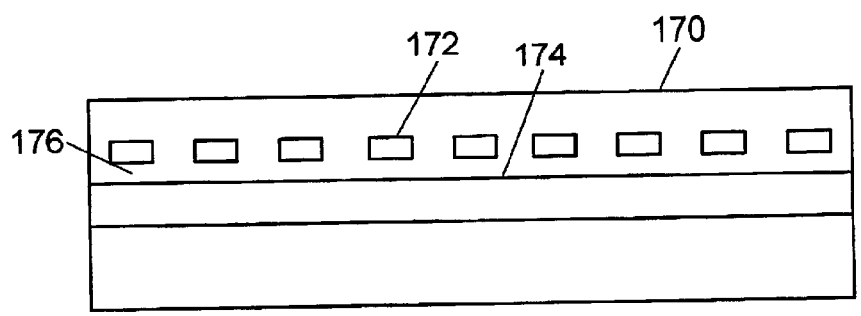
FIG. 5 is a schematic cross-sectional view of a second alternative embodiment of a grating reflector structure, according to the invention.

Different types of grating structures may be used in the tuning region, including, for example, square well gratings, triangular gratings, sinusoidal gratings. In addition, a sampled grating structure 150, such as that illustrated in FIG. 4, can be used as a tuning region. In a sampled grating structure 150, the tunable grating reflector structure 152 includes one or more sections 154, each section containing a grating region 156 and a non-grating region 158. Examples of and discussions regarding sampled grating structures can be found in, for example, "Tunable Laser Diodes", by M. C. Amann and J. Buus, Artech House, Norwood, Mass., 1998, incorporated herein by reference. Other grating structures include superstructure gratings which have a super period so that a section is repeated. The section often contains a periodic structure, although this is not required. Another example of a grating reflector structure 170 that can be used as a tuning region is illustrated in FIG. 5. In this example, a buried grating structure 172 is separated by semiconductor material 176 from a waveguide 174 which can be an extension of the waveguide of the gain region.

The wide bandwidth grating reflector structure 116 of the output coupler section 106 can have the same or a different grating structure (e.g., continuous grating, sampled grating, superstructure grating, or buried grating), grating type (e.g., square well, triangular, sinusoidal, or blazed), and grating period as the tunable grating reflector structure 114 of the tuning region 104. In some instances, the periodicity of the wide bandwidth grating reflector structure 116 may be selected so that the periodicity of the grating reflector structure 116 is detuned from the laser wavelength. In other words, the optical length of the periodicity of the wide bandwidth grating reflector structure 116 need not be a multiple of the wavelength of light at the laser frequency. Alternatively, if electrodes 120, 126 are provided for tuning of the wide bandwidth grating reflector structure 116, the wide bandwidth grating reflector structure 116 may be detuned from the laser frequency to decrease reflectivity at the laser wavelength.

The reflectivity bandwidth of the wide bandwidth grating reflector structure 116 may have a bandwidth comparable to, or even larger than, the bandwidth over which the laser 100 is to be tuned. In comparison, the tunable grating reflector structure 114 typically has a reflection spectrum with one or more peaks that are sufficiently narrow as to permit selection of a cavity mode for oscillation. Where the tunable grating reflector structure 114 has a plurality of reflection peaks, an additional wavelength selective region in the laser cavity may be used to select oscillation at a selected one of the reflectivity peaks.

Figure 8:
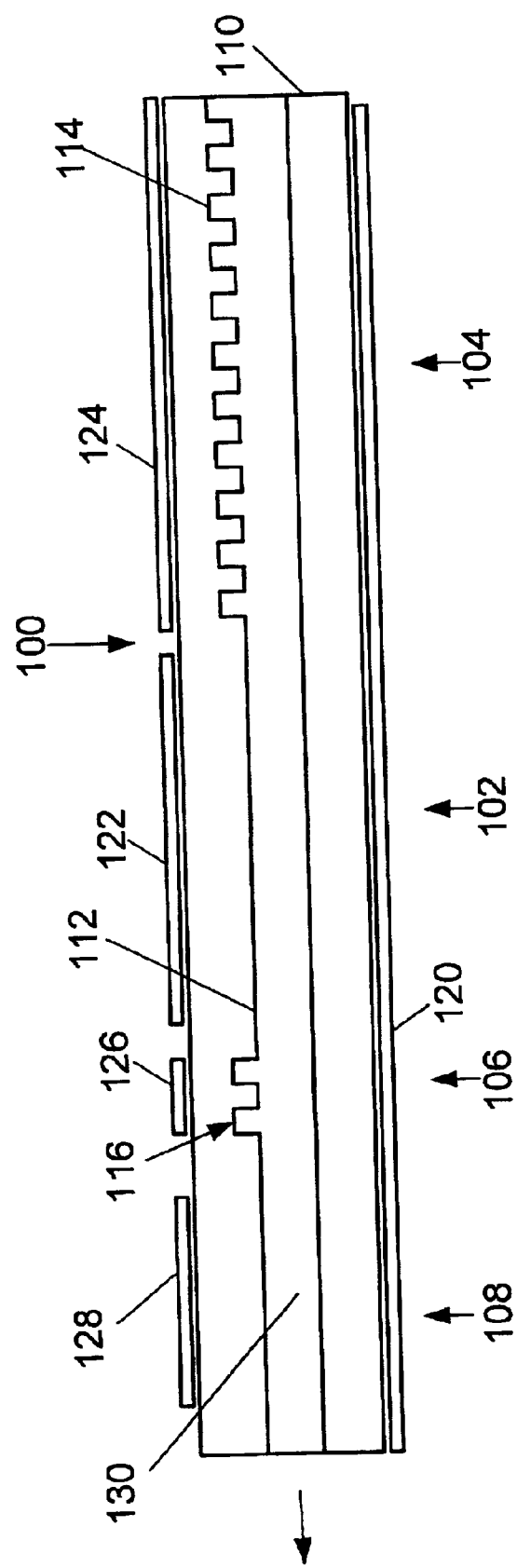
FIG. 8 is a schematic cross-sectional view of the laser of FIG. 3 integrated with an extracavity device.

An embodiment of the laser 100 is shown in FIG. 8 integrated with an extracavity device 130. The substrate 110 extends beyond the end of the output coupler 106, and light passing along the waveguide 112 to the left of the output coupler 106 is transmitted to the integrated extracavity device. The extracavity device may be any suitable type of device integrated on the substrate that operates on the light output from the laser 100. For example, the extracavity device 130 may be a modulator, such as an electroabsorption modulator, Mach Zehnder modulator, a phase modulator or the like, for modulating the light output from the laser 100. In another example, the integrated extracavity device 130 may be a semiconductor amplifier for amplifying the light output from the laser 100. Where the integrated extracavity device 130 is an active device, such as a modulator or an amplifier, the device 130 may be provided with one or more electrodes 128 to provide active control. The common electrode 120 may also extend under the active device 130, although this is not a requirement. The device 130 may also be provided with a separate electrode under the substrate.

The integrated extracavity device 130 may also be a passive device. For example, a passive extracavity device may be a coupler to couple the output from the laser 100 with the output from one or more other lasers. In another example, the device may be a waveguide splitter to split the light output from the laser 100 into two or more parts that are transmitted to different destinations.

Another embodiment of a tunable semiconductor laser 200 is illustrated in FIG. 6. This semiconductor laser 200 includes a substrate 210, gain region 202, tuning region 204, output coupler 206, and phase region 208. A common electrode 220 may be disposed on the base of the substrate. The gain region 202 includes an active waveguide 212 and electrode 222; the tuning region 204 includes a tunable grating reflector structure 214 and electrode 224; and the output coupler 206 includes a wide bandwidth grating reflector structure 216 and, optionally, an electrode 226. The design considerations for the gain region 202, tuning region 204, and output coupler 206 are the same as discussed above for the semiconductor laser illustrated in FIG. 3.

The phase region 208 provides additional fine tuning. The phase region 208 includes a waveguide 213 that, in this instance, is an extension of the waveguide 212 of the gain region 202. An electrode 228 is disposed on the phase region 208 for tuning. For example, a forward bias voltage may be applied to the electrode 228 so as to inject carriers into the phase region 208, thus changing its refractive index. This changes the oscillating frequency of any modes oscillating in the laser 200. In particular, this mechanism can be used to fine tune a single mode of the laser to a particular frequency. Alternatively, a reverse bias voltage may be applied to the phase region 208 to alter its refractive index. The phase region may also be positioned between the gain region 202 and the output coupler 206.

Another embodiment of a tunable semiconductor laser 300 is illustrated in FIG. 7. This semiconductor laser 300 includes a substrate 310, gain region 302, tuning region 304, output coupler 306, phase region 308, and coupling region 309. A common electrode 320 may be applied to the base of the substrate 310.

The gain region 302 includes an active waveguide 312 and electrode 322; the tuning region 304 includes a tunable grating reflector structure 314 and electrode 324; the output coupler 306 includes a wide bandwidth grating reflector structure 316 and, optionally, electrode 326; and the phase region 308 includes a waveguide 313 and electrode 328.

The coupling region 309 includes first and second waveguides 330 and 332 that are separated by semiconductor material. An electrode 329 may be provided on the coupling region 309 for tuning the coupling region 309. The first waveguide 330 is typically an extension from the active waveguide 312 of the gain region 302. The second waveguide 332 typically extends through the tuning region 304. The first and second waveguides 330 and 332 are typically formed of materials with different refractive indices, different thicknesses, widths, or any combination of these differences. The differences result in wavelength dependent coupling between the two waveguides 330 and 332 in which only light within a particular wavelength range is coupled from one waveguide to the other. The effects of wavelength-dependent coupling in the coupling region 309 and wavelength-dependent reflection in the tuning region 304 may together produce a widely tunable, single mode laser. For example, the tuning region 304 may include a sampled grating reflector that reflects light at a number of spaced wavelengths, $\lambda p1, \lambda p2, \ldots, \lambda pn$, while the coupling region couples light, within a certain bandwidth, $\Delta \lambda_c$, between the two waveguides 330 and 332. By overlapping the peak coupling wavelength with one of the reflection peaks of the tuning region 304, the laser may select a narrow wavelength range, as narrow as a single longitudinal mode, for oscillation. Examples of coupling regions and their use in tuning lasers may be found in U.S. Pat. No. 5,621,828 and Rigole, et al., *IEEE Photonics Technology Letters* vol. 7, pp. 697–699 (1995), both of which are incorporated herein by reference.

The tunability of the laser 300 is described with reference to FIG. 10B, which shows the reflectivity profile 1054 of the output coupler 316 and the reflectivity profile 1052 of a sampled grating reflector. The reflectivity profile 1052 of the sampled grating reflector has a number of reflection peaks 1056, the figure illustrating three reflection peaks at wavelengths $\lambda p1, \lambda p2$, and $\lambda p3$, although there may be more. The reflectivity profile 1054 of the output coupler 316 typically has a bandwidth, $\Delta \lambda_R$, that is significantly larger than the bandwidth of any of the reflection peaks 1056 of the sampled grating reflector reflectivity profile 1052. The value of $\Delta \lambda_R$ may also be larger than the separation, $\Delta \lambda p$, between two reflectivity peaks and may be larger than the tuning range of the laser 300. It will be appreciated that the reflectivity peaks 1056 may be tuned to different wavelengths by application of a tuning current to the tuning region 304.

Figure 10B:
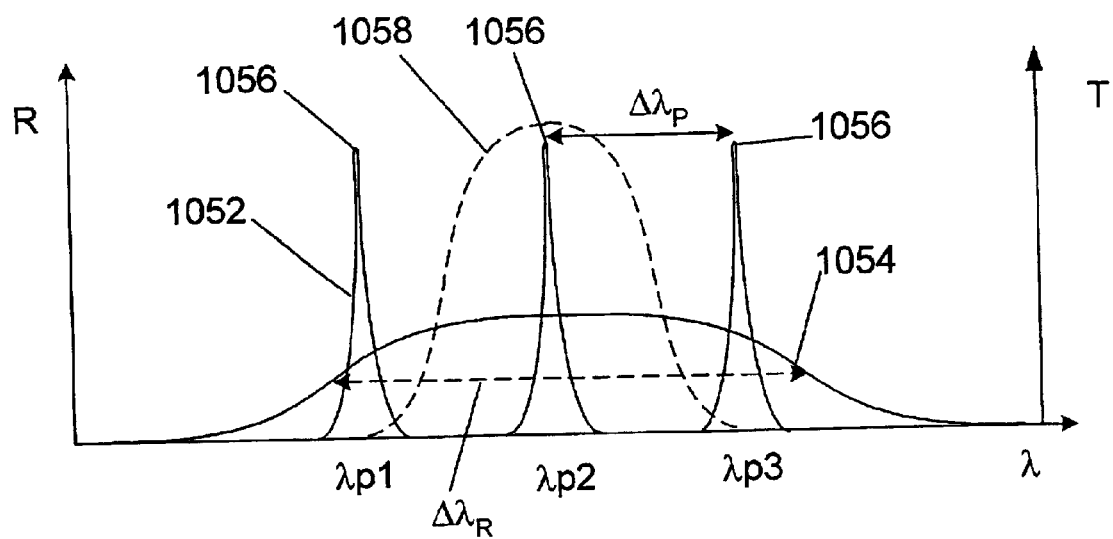

FIG. 10B also shows the transmission profile 1058 (dashed line), T, of the coupler region 309 as a function of wavelength. The transmission profile 1058 has a peak of high transmission, with areas of low transmission on either side. The high transmission peak is typically set to overlap one of the reflectivity peaks 1056 of the tuning region 304 so as to select oscillation on that particular reflection peak 1056. In the example illustrated in the figure, the transmission peak is overlapped with the reflectivity peak at $\lambda p2$, which enables oscillation at $\lambda p2$ and suppresses oscillation at the other wavelength peaks 1056. Typically, the FWHM width of the transmission peak of the coupler region 309 is less than the spacing, $\Delta \lambda p$, between reflection peaks 1056. The wavelength of peak transmission of the transmission profile 1058 may be altered by changing the injection current in the coupler region 309, so as to select different reflection peaks 1056.

It will be appreciated that other types of tunable laser may use a wide bandwidth grating reflector as an output coupler. For example, the tuning region may include a Y-coupler with sampled gratings on either branch, where the period of the sampled gratings is different, as is further described in European Patent Application No 1094574, filed on Oct. 19, 1999, by G. Sarlet, J. Buus and R. Baets, incorporated herein by reference. The types of tunable laser described herein are provided for illustrative purposes only and are not intended to limit the invention.

Figure 9:
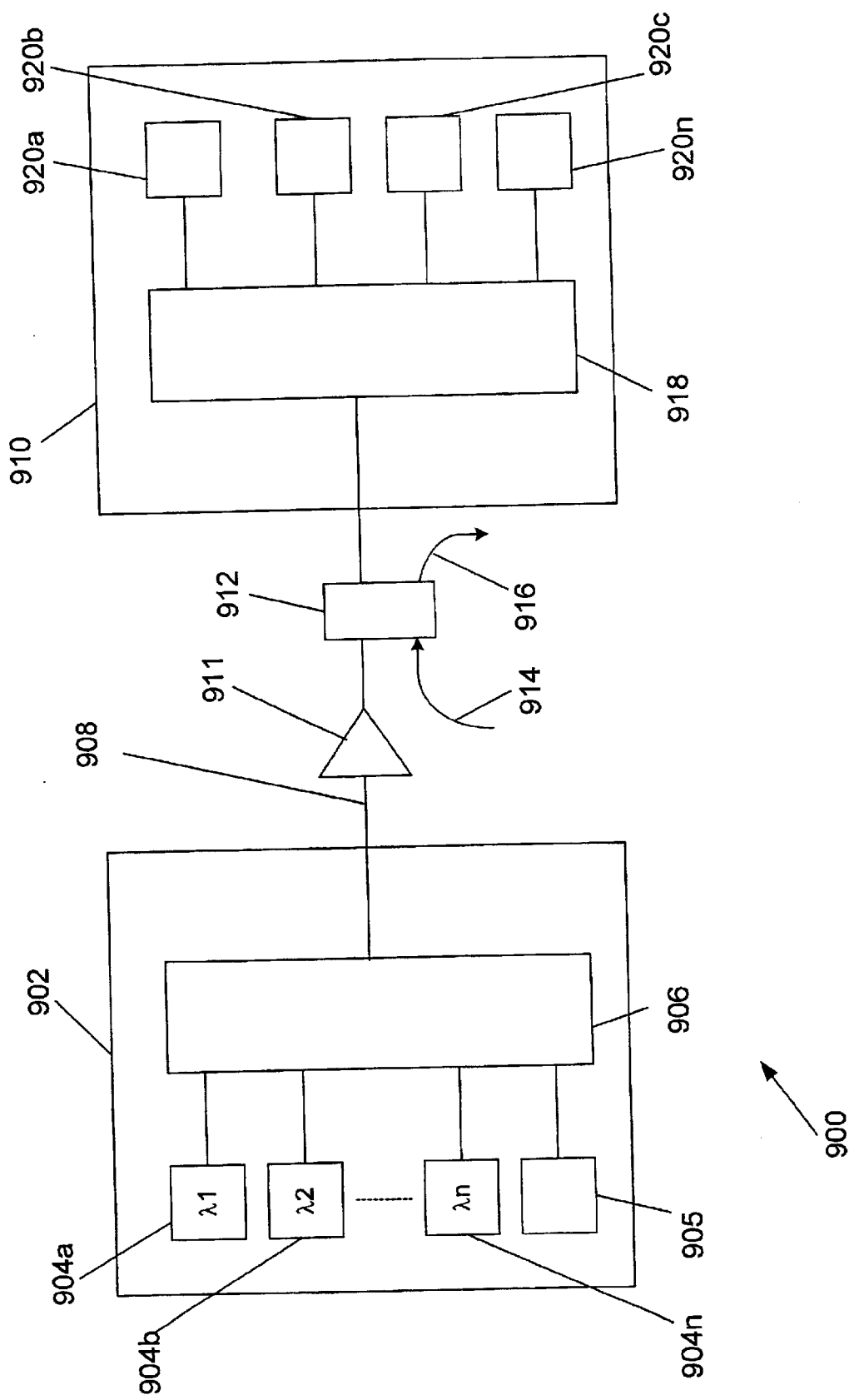
FIG. 9 is a schematic view of an optical communications system that incorporates a laser according to an embodiment of the present invention.

A laser incorporating the present invention may be employed in a WDM communications system, as illustrated in FIG. 9. The system 900 includes a WDM transmitter unit 902 that includes a number of lasers 904a–904n operating at different wavelengths, $\lambda 1-\lambda n$. Any of the lasers 904a–904n may be a laser incorporating the present invention. In addition, one or more spare lasers 905 may operate as a substitute if any of the lasers 904a–904n fail. The lasers 904a–904n, 905 may each include modulators for modulating information onto the respective output light beams. The modulators may be integrated onto the substrates of the lasers 904a–904n, 905.

The outputs from the lasers 904a–904n, 905 are combined in a WDM combiner arrangement 906 and launched as a WDM signal into a fiber link 908 that is directed to a WDM receiver 910. The fiber link 908 may include one or more fiber amplifier stages 911 to amplify the WDM signal as it propagates to the WDM receiver 910. Furthermore, the fiber link 908 may include one or more switching units 912, for example optical add/drop multiplexers, that permit the signal generated in the transmitter unit 902 to be combined with signals 914 from other transmitter units, or which may split off certain channels 916 of the signal for detection in a different receiver unit. The WDM receiver 910 demultiplexes the WDM signal in a demultiplexer 918 and directs signals at different wavelengths $\lambda 1-\lambda n$ to respective detectors 920a–920n.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. A tunable semiconductor laser, comprising:
   a substrate;
   a gain region disposed on the substrate and including an active waveguide;
   a tunable, wavelength-selective reflector on the substrate, tunable over a laser wavelength tuning range and coupled to reflect light received from a first end of the active waveguide; and an output coupler disposed on the substrate to reflect a portion of light received from a second end of the active waveguide, the output coupler including a wide bandwidth grating reflector structure having a reflection bandwidth greater than or approximately equal to the laser wavelength tuning range.

2. The laser of claim 1, wherein the wide bandwidth grating reflector structure has a reflection bandwidth at least five times greater than a peak reflection bandwidth of the wavelength-selective reflector.

3. The laser of claim 1, wherein the wide bandwidth grating reflector is tunable.

4. The laser of claim 1, wherein reflectivity of the wide bandwidth grating reflector structure is no more than 10% for wavelengths within the laser wavelength tuning range.

5. The laser of claim 4, wherein the reflectivity of the wide bandwidth grating reflector structure is no more than 5% for wavelengths within the laser wavelength tuning range.

6. The laser of claim 1, wherein the wide bandwidth grating reflector structure has a length of no more than 100 $\mu$m.

7. The laser of claim 6, wherein the wide bandwidth grating reflector structure has a length of no more than 30 $\mu$m.

8. The laser of claim 1, wherein the reflection bandwidth of the wide bandwidth grating reflector is at least 8 nm.

9. The laser of claim 1, wherein the wavelength-selective reflector includes a grating structure having a length at least five times longer than a length of the wide bandwidth grating reflector structure.

10. The laser of claim 1, where the wavelength-selective reflector has more than one reflection peak.

11. The laser of claim 1, further comprising a coupling region, the coupling region comprising a first waveguide and a second waveguide spaced apart by semiconductor material from the first waveguide, wherein the first waveguide is an extension from the active waveguide and the second waveguide extends towards the wavelength selective reflector.

12. The laser of claim 1, wherein the tunable wavelength-selective reflector includes a tunable grating reflector.

13. The laser of claim 12, wherein the tunable grating reflector structure has a reflectivity of at least 50% for at least one wavelength in the laser wavelength tuning range.

14. The laser of claim 1, further comprising a tunable phase region disposed between the output coupler and the tunable wavelength-selective reflector.

15. The laser of claim 1, further comprising an extracavity device disposed on the substrate, the extracavity device being optically coupled to the output coupler by a waveguide on the substrate.

16. The laser of claim 15, wherein the extracavity device is an active device.

17. The laser of claim 16, wherein the extracavity device is an amplifier.

18. The laser of claim 16, wherein the extracavity device is a modulator.

19. The laser of claim 15, wherein the extracavity device is a passive device.

20. The laser of claim 19, wherein the extracavity device is a coupler.

21. The laser of claim 19, wherein the extracavity device is a splitter.

22. A method of operating a tunable semiconductor laser, the method comprising:

coupling light out of a tunable semiconductor laser using a wide bandwidth grating reflector structure having a reflectivity bandwidth approximately equal to or broader than a laser wavelength tuning range wherein the laser comprises a gain region, including an active waveguide, disposed on a substrate, a tunable, wavelength-selective reflector is disposed on the substrate and is coupled to reflect light received from a first end of the active waveguide, the laser is tunable over the laser wavelength tuning range, and the wide band grating reflector structure is disposed on the substrate to reflect a portion of light received from a second end of the active waveguide.

23. The method of claim 22, wherein the wide bandwidth grating reflector structure has a bandwidth that is at least five times a bandwidth of the tunable grating reflector structure.

24. The method of claim 22, further the wide bandwidth grating reflector structure has a reflectivity of no more than 10% at a laser operating wavelength.

25. A tunable semiconductor laser, comprising:

a substrate;

amplifying means for amplifying light disposed on the substrate;

reflecting means on the substrate for selectively reflecting light, received from one end of the amplifying means, at a particular wavelength back to the amplifying means; and grating output coupling means on the substrate for coupling light out from another end of the amplifying means, wherein a reflectivity bandwidth of the grating output coupling means is approximately equal to or broader than a laser wavelength tuning range.

26. A communications system, comprising:

an optical transmitter unit, having a laser that includes
a substrate,
a gain region disposed on the substrate and including an active waveguide,
a tunable, wavelength-selective reflector on the substrate, tunable over a laser wavelength tuning range and disposed to reflect light received from a first end of the active waveguide, and
an output coupler disposed on the substrate to reflect a portion of light received from a second end of the active waveguide, the output coupler including a wide bandwidth grating reflector structure having a reflection bandwidth approximately equal to or broader than the laser wavelength tuning range;

an optical receiver unit, and a fiber optic communications link coupled between the optical transmitter unit and the optical receiver unit.

27. The system of claim 26, further comprising at least one fiber amplifier unit included in the fiber link between the optical transmitter unit and the optical receiver unit.

28. The system of claim 26, further comprising at least one switching unit included in the fiber link between the optical transmitter unit and the optical receiver unit.

29. The system of claim 26, wherein the optical transmitter unit includes a plurality of laser units producing modulated optical signals at respective wavelengths, and a wavelength multiplexing unit to multiplex the modulated optical signals into a wavelength multiplexed signal coupled into the fiber link.

30. The system of claim 26, wherein the receiver unit includes a demultiplexer unit coupled to demultiplex the wavelength multiplexed signal received from the transmitter unit and to direct individual channel signals to respective channel detectors.

31. A tunable semiconductor laser, comprising:

a substrate;

a gain region disposed on the substrate and including an active waveguide;

a tunable, wavelength-selective reflector disposed on the substrate and coupled to reflect light received from a first end of the active waveguide, a reflection spectrum of the tunable, wavelength-selective reflector having at least two reflection peaks separated by a peak separation; and an output coupler disposed on the substrate and coupled to reflect a portion of light received from a second end of the active waveguide, the output coupler including a wide bandwidth grating reflector structure having a reflection bandwidth larger than the peak separation.

32. The laser of claim 31, wherein the wide bandwidth grating reflector comprises a tunable, wide bandwidth grating reflector.

33. The laser of claim 31, wherein reflectivity of the wide bandwidth grating reflector structure is no more than 10% for wavelengths over an operable lasing wavelength band of the tunable laser.

34. The laser of claim 33, wherein the reflectivity of the wide bandwidth grating reflector structure is no more than 5% for wavelengths over the operable lasing wavelength band of the tunable laser.

35. The laser of claim 31, wherein the wide bandwidth grating reflector structure has a length of no more than 100 $\mu$m.

36. The laser of claim 35, wherein the wide bandwidth grating reflector structure has a length of no more than 30 $\mu$m.

37. The laser of claim 31, wherein the reflection bandwidth of wide bandwidth grating reflector is at least 8 nm.

38. The laser of claim 31, wherein the tunable, wavelength-selective reflector includes a grating reflector structure having a length at least five times a length of the wide bandwidth grating reflector structure.

39. The laser of claim 31, wherein the tunable wavelength-selective reflector includes a tunable grating reflector.

40. The laser of claim 31, further comprising a coupling region, the coupling region comprising a first waveguide and a second waveguide spaced apart by semiconductor material from the first waveguide, wherein the first waveguide extends from the active waveguide and the second waveguide extends towards the tunable, wavelength-selective reflector.

41. The laser of claim 31, wherein the tunable laser has an operable laser wavelength band and the tunable wavelength-selective reflector has a reflectivity of at least 50% for a wavelength within the operable laser wavelength band.

42. The laser of claim 31, further comprising a tunable phase region disposed between the output coupler and the tunable, wavelength-selective reflector.

43. The laser of claim 31, further comprising an extracavity device disposed on the substrate, the extracavity device being optically coupled to the output coupler by a waveguide on the substrate.

44. The laser of claim 43, wherein the extracavity device is an active device.

45. The laser of claim 44, wherein the extracavity device is an amplifier.

46. The laser of claim 44, wherein the extracavity device is a modulator.

47. The laser of claim 43, wherein the extracavity device is a passive device.

48. The laser of claim 47, wherein the extracavity device is a coupler.

49. The laser of claim 47, wherein the extracavity device is a splitter.

50. A method of operating a tunable semiconductor laser, the method comprising:

coupling light out of a tunable semiconductor laser using a wide bandwidth grating reflector structure having a reflectivity bandwidth wider than a peak separation between reflectivity peaks of a tunable, wavelength-selective reflector of the laser wherein the laser comprises a gain region, including an active waveguide, disposed on a substrate, the tunable, wavelength-selective reflector is disposed on the substrate and is coupled to reflect light received from a first end of the active waveguide, a reflection spectrum of the tunable, wavelength-selective reflector has at least two reflection peaks separated by the peak separation and he wide bandwidth grating reflector structure is disposed on the substrate to reflect a portion of light received from a second end of the active waveguide.

51. The method of claim 50, wherein the wide bandwidth grating reflector structure has a reflectivity of no more than 10% at a laser operating wavelength.

52. The method of claim 50, further comprising selecting one of the reflectivity peaks for laser oscillation.

53. A tunable semiconductor laser, comprising:

a substrate;

amplifying means for amplifying light, the amplifying means being disposed on the substrate;

reflecting means for selectively reflecting light received from one end of the amplifying means at a particular wavelength back to the amplifying means, the reflecting means being disposed on the substrate and defining at least two reflection peaks separated by a peak wavelength separation; and output coupling means disposed on the substrate for coupling light out from the amplifying means, wherein a grating reflectivity bandwidth of the output coupling means is wider than the peak wavelength separation.

* * * * *

UNITED STATES PATENT AND TRADEMARK OFFICE
CERTIFICATE OF CORRECTION

| | | |
|---|---|---|
| PATENT NO. | : 6,822,980 B2 | Page 1 of 4 |
| APPLICATION NO. | : 09/915046 | |
| DATED | : November 23, 2004 | |
| INVENTOR(S) | : Lundqvist | |

It is certified that error appears in the above-identified patent and that said Letters Patent is hereby corrected as shown below:

Item 56
Please include these US Patent Documents on the Title Page of the issued patent:

--5,642,371   06-1997   Tohyama et al.
4,896,325    01-1990   Coldren, Larry a.
5,621,828    04-1997   Baets et al.
5,991,061    11-1999   Adams et al.
2003/0035455  02-2003  Stefens, Wolf
5,379,318    01-1995   Weber, Jean-Pierre
6,408,014    06-2002   Ackerman et al.
5,155,737    10-1992   Ikeda et al.
6,483,955    11-2002   Shiozaki et al.
5,621,828    04-1997   Baets et al.
4,896,325    01-1990   Coldren, Larry A.
5,651,018    07-1997   Mehuys et al.
6,018,406    01-2000   Ishimatsu et al.
5,379,318    01-1995   Weber, Jean-Pierre
5,568,311    10-1996   Matsumoto, Keisuke
5,926,497    07-1999   Nitta et al.
4,852,108    07-1989   Utaka et al.
4,719,636    01-1988   Yamaguchi, Masayuki
5,581,572    12-1996   Delorme et al.
5,157,681    10-1992   Aoyagi et al.
5,325,392    06-1994   Tohmori et al.
5,841,799    11-1998   Hiroki, Tamayo
6,208,793    03-2001   Hillmer et al.
4,885,753    12-1989   Okai et al.
5,177,758    01-1993   Oka et al.
5,757,828    05-1998   Ouchi, Toshihiko
6,108,362    08-2000   Adams et al.
4,920,542    04-1990   Brosson et al.
4,995,048    02-1991   Kuindersma et al.
5,696,779    12-1997   Welch et al.

EP    0 926 787 A1    6/1999
EP    1 094 574 A1    2/2001--

UNITED STATES PATENT AND TRADEMARK OFFICE
CERTIFICATE OF CORRECTION

| | |
|---|---|
| PATENT NO. | : 6,822,980 B2 |
| APPLICATION NO. | : 09/915046 |
| DATED | : November 23, 2004 |
| INVENTOR(S) | : Lundqvist |

It is certified that error appears in the above-identified patent and that said Letters Patent is hereby corrected as shown below:

Please include the following Non-Patent Literature on the Title of the issued patent:

--R. Gaudino et al., "MOSAIC: A Multiwavelength Optical Subcarrier Multiplexed Controlled Network", *IEEE Journal On Selected Areas in Communications,* 16:7, pp. 1270-1285 (September 1998).

V. Jayaraman et al., "Continuous-Wave Operation of Sampled Grating Tunable Lasers with 10 mwatt Output Power, >60mn tuning, and Monotonic Tuning Characteristics", *Indium Phosphide Conference, Santa Barbara, paper no. MC2,* 82-85 (March 1994).

V. Jayaraman, et al., "Widely tunable continuous-wave InGaAsP/InP sampled grating lasers", *Electronic Letters,* 30:18, pp. 1492-1494 (September 1994).

S.L. Lee et al., "Dynamic Responses of Widely Tunable Sampled Grating DBR Lasers", *IEEE Photonics Technology Letters,* 8:12, pp. 72-74 (December 1996).

B. Mason et al., "Sampled Grating DBR Laser With 22 nm Quasi-continuous Tuning and Monolithically Integrated Wavelength Monitors", *International Semiconductor Laser Conference '98, paper no. ThC4,* Nara, Japan, pp. 22-23 (October 409, 1998).

B. Mason et al., "Widely Tunable Laser for Wavelength-division Multiplexed Communications", *Optical Fiber Communication '97 (OFC), paper no. ThM2,* pp. 296-297, Dallas, TX (February 16-21, 1997).

A. A. Saavedra et al., "Amplitude and Frequency Modulation Characteristics of Widely Tunable GCSR Lasers", *IEEE Photonics Technology Letters, 10:10,* pp. 1383-1385 (October 1998).

M. Shell et al., "Experimental Demonstration of an All-Optical Routing Node for Multihop Wavelength Routed Networks", *IEEE Photonics Technology Letters, 8:10,* pp. 1391-1393 (October 1996).

UNITED STATES PATENT AND TRADEMARK OFFICE
CERTIFICATE OF CORRECTION

PATENT NO.        : 6,822,980 B2
APPLICATION NO. : 09/915046
DATED             : November 23, 2004
INVENTOR(S)       : Lundqvist It is certified that error appears in the above-identified patent and that said Letters Patent is hereby corrected as shown below:

V. Jayaraman et al., "Extended Tuning Range Semiconductor Lasers with Sampled Gratings," LEOS'91, San Jose, CA, p.82, paper no. SDL 15.5, November 4-7, 1991.

V. Jayaraman et al., "Wide Tunability and Large Mode-Suppression in a Multi-section Semiconductor Laser using Sample Gratings." Integrated Photonics Research'92, New Orleans, LA, paper no WF!, pp. 306-307, April 13-16, 1992.

V. Jayaraman et al., "Theory, Design, and Performance of Extended Tuning Range Semiconductor Lasers with Sampled Gratings," IEEE Journal of Quantum Electronics, vol.29, no. 6, pp. 92-102, June 1993.

Rigole et al., "114-nm Wavelength Tuning Range of a Vertical Grating Assisted Codirectional Coupler Laser with a Super Structure Grating Distributed Bragg Reflector," IEEE Photonics Technology Letters, vol. 7, no. 7, pp. 697-699, July 1995.

Mason et al., "Ridge Waveguide Sampled Grating DBR Lasers with 22-nm Quasi-Continous Tuning Range." IEEE Photonics Technology Letters, vol. 10, no. 9, pp. 1211-1213, September 1998.

A. Saavedra et al., "Relative Intensity Noise and Linewideth Measurements of a Widely Tunable GCSR Laser," IEEE Photonics Technology Letters, vol. 10, no. 4, pp. 481-483, April 1998.

Mason et al., "Widely Tunable Sampled Grating DBR Laser with Integrated Electroabsorption Modulator," IEEE Photonics Technology Letters, vol. 11, no. 6, pp. 638-640, June 1999.

Mason et al., "Design of Sampled Grating DBR Lasers with Integrated Semiconductor Optical Amplifiers," IEEE Photonics Technology Letters, vol. 12, no. 7, pp. 762-64, July 2000.--

UNITED STATES PATENT AND TRADEMARK OFFICE
CERTIFICATE OF CORRECTION

PATENT NO. : 6,822,980 B2
APPLICATION NO. : 09/915046
DATED : November 23, 2004
INVENTOR(S) : Lundqvist It is certified that error appears in the above-identified patent and that said Letters Patent is hereby corrected as shown below:

Column 12, Line 4, please insert a --;-- after the first occurrence of the word "range"

Column 12, Line 9, please replace "band" with --bandwidth--

Column 14, Line 24, please insert a --;-- after "laser"

Column 14, Line 31, please replace "he" with --the--

Signed and Sealed this

Fifth Day of February, 2008

JON W. DUDAS
*Director of the United States Patent and Trademark Office*